United States Patent
Kim

(10) Patent No.: US 7,659,667 B2
(45) Date of Patent: Feb. 9, 2010

(54) PLASMA DISPLAY DEVICE WITH CHASSIS BASE FORMED OF PLASTIC AND CONDUCTIVE MATERIAL

(75) Inventor: Yeung-Ki Kim, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 643 days.

(21) Appl. No.: 11/338,387

(22) Filed: Jan. 24, 2006

(65) Prior Publication Data

US 2006/0163987 A1 Jul. 27, 2006

(30) Foreign Application Priority Data

Jan. 26, 2005 (KR) .................. 10-2005-0007219

(51) Int. Cl.
 *H01J 17/49* (2006.01)
(52) U.S. Cl. ...................... 313/582; 313/587
(58) Field of Classification Search .......... 313/582–587
 See application file for complete search history.

(56) References Cited

U.S. PATENT DOCUMENTS

| | | | |
|---|---|---|---|
| H526 H * | 9/1988 | Miller | 361/818 |
| 6,923,703 B2 * | 8/2005 | Furukawa | 445/24 |
| 7,436,654 B2 | 10/2008 | Cho | |
| 7,510,291 B2 | 3/2009 | Song et al. | |
| 2002/0195937 A1 | 12/2002 | Kim | |
| 2004/0036413 A1 * | 2/2004 | Bae et al. | 313/582 |
| 2005/0047068 A1 * | 3/2005 | Kim | 361/681 |
| 2005/0062383 A1 | 3/2005 | Bae | |
| 2005/0067956 A1 | 3/2005 | Kim | |
| 2005/0088097 A1 * | 4/2005 | Bae et al. | 313/587 |
| 2005/0110407 A1 | 5/2005 | Kim | |
| 2005/0194900 A1 * | 9/2005 | Kim et al. | 313/582 |

(Continued)

FOREIGN PATENT DOCUMENTS

JP 2000-10492 1/2000

(Continued)

OTHER PUBLICATIONS

First Office Action for Chinese Patent Application No. 200610006969.5 dated Jul. 4, 2008.

(Continued)

*Primary Examiner*—Toan Ton
*Assistant Examiner*—Kevin Quarterman
(74) *Attorney, Agent, or Firm*—Knobbe Martens Olson & Bear LLP

(57) ABSTRACT

A plasma display device is disclosed. In one embodiment, the plasma display device includes a plasma display panel on which an image is displayed, a chassis base coupled to the rear side of the plasma display panel and formed of a material in which plastic and a conductive material are mixed, and at least one circuit board mounted on the rear side of the chassis base and driving the plasma display panel. According to embodiments of the present invention, a lightweight plasma display device can be manufactured, since the weight of the chassis base can be reduced by manufacturing the chassis base from a mixed material of plastic and a conductive material. Also, the grounding and EMI shielding of the circuit board or a signal transmitting member can be achieved.

22 Claims, 3 Drawing Sheets

U.S. PATENT DOCUMENTS

| | | | |
|---|---|---|---|
| 2005/0264198 A1* | 12/2005 | Woo et al. | 313/582 |
| 2005/0285526 A1 | 12/2005 | Moon et al. | |
| 2006/0087233 A1* | 4/2006 | Kim et al. | 313/582 |
| 2006/0109206 A1* | 5/2006 | Kim | 345/60 |
| 2006/0164840 A1 | 7/2006 | Song et al. | |

FOREIGN PATENT DOCUMENTS

| | | |
|---|---|---|
| JP | 2000-010493 | 1/2000 |
| JP | 2000-181370 | 6/2000 |
| JP | 2000-183572 | 6/2000 |
| JP | 201-324942 | 11/2001 |
| JP | 2002-006756 | 1/2002 |
| JP | 2002-123178 | 4/2002 |
| JP | 2002-196683 | 7/2002 |
| JP | 2003-051684 | 2/2003 |
| JP | 2004-161918 | 6/2004 |
| JP | 2004-309544 | 11/2004 |
| KR | 10-2004-0024411 | 3/2004 |

OTHER PUBLICATIONS

Notice to Submit Response by Korean Intellectual Property Office on Sep. 22, 2006.

Second Office Action for Chinese Patent application No. 200610006969.5 dated Feb. 27, 2009 by State Intellectual Property Office, P.R. China.

Office Action for U.S. Appl. No. 11/585,514 dated Jul. 10, 2009.

Notice of Allowance for U.S. Appl. No. 11/504,135 dated Sep. 4, 2009.

* cited by examiner

PLASMA DISPLAY DEVICE WITH CHASSIS BASE FORMED OF PLASTIC AND CONDUCTIVE MATERIAL

CROSS-REFERENCE TO RELATED PATENT APPLICATION

This application claims the benefit of Korean Patent Application No. 10-2005-0007219, filed on Jan. 26, 2005, in the Korean Intellectual Property Office, the disclosure of which is incorporated herein in its entirety by reference.

BACKGROUND OF THE INVENTION

1. Field of the Invention

The present invention relates to a plasma display device, and more particularly, to a plasma display device having an improved chassis base structure coupled to the rear of the plasma display device.

2. Description of the Related Technology

A plasma display device is a flat panel display device which displays images by using a discharge effect. Due to its strong performance and characteristics such as high resolution, high luminance, high contrast, shorter image sticking (short-time image-retention), and large viewing angle, and a large but thin screen size, the plasma display device is expected to be the next generation display device which will replace the cathode ray tube (CRT).

Typically, the plasma display device includes i) a plasma display panel, ii) a chassis base coupled to the rear of the plasma display panel, iii) circuit boards that drive the plasma display panel and are mounted on the rear of the chassis base, and iv) a case that accommodates the plasma display panel, the chassis base, and the circuit boards.

The chassis base is generally formed of a metal such as aluminum, and dissipates heat generated by the plasma display panel and supports the plasma display panel and the circuit boards.

However, the metal chassis base may add excessive weight to the plasma display device. Furthermore, to mount the circuit substrates to the metal chassis base, the mounting structure must be manufactured and an additional process for mounting the mounting structure on the chassis base is required, thereby increasing manufacturing costs.

SUMMARY OF CERTAIN INVENTIVE ASPECTS

One aspect of the present invention provides a lightweight plasma display device which provides grounding and electromagnetic interference (EMI) shielding of electrical circuits or a signal transmitting member through a chassis base by manufacturing the chassis base from a mixed material of plastic and a conductive material.

Another aspect of the present invention provides a plasma display device comprising: i) a plasma display panel on which an image is displayed, ii) a chassis base coupled to the rear side of the plasma display panel and formed of a material in which plastic and a conductive material are mixed, and iii) at least one circuit substrate mounted on the rear side of the chassis base and driving the plasma display panel.

In one embodiment, the chassis base may comprise a main body formed of plastic and a conduction unit formed of a conductive material distributed over the main body.

In one embodiment, the chassis base may comprise a main body formed of plastic and a conduction unit formed of a conductive material on at least part of the outer surface of the main body.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Embodiments of the present invention will now be described more fully with reference to the accompanying drawings, in which exemplary embodiments of the invention are shown.

Figure 1:
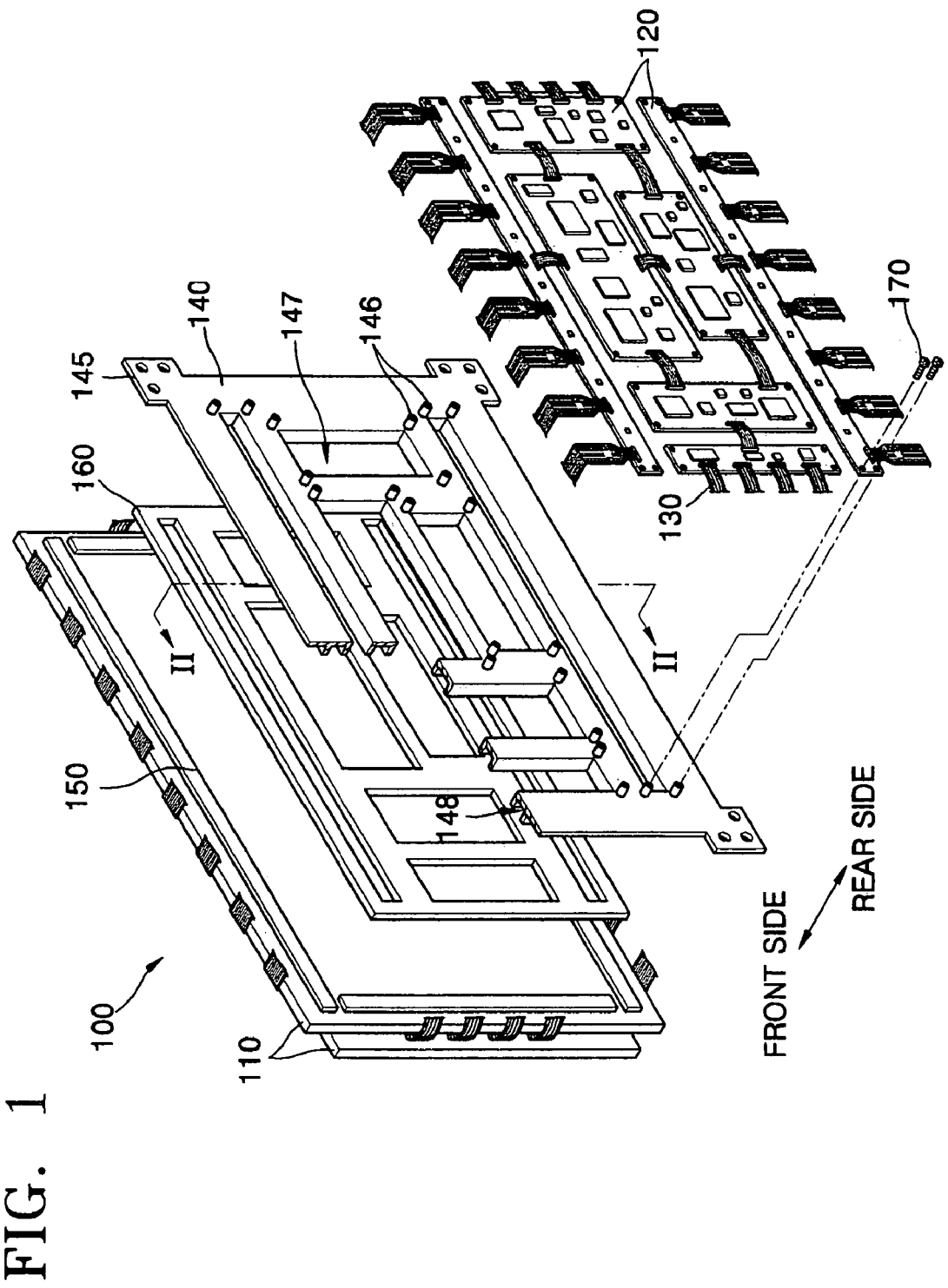
FIG. 1 is an exploded perspective view of a plasma display device according to an embodiment of the present invention.
Figure 2:
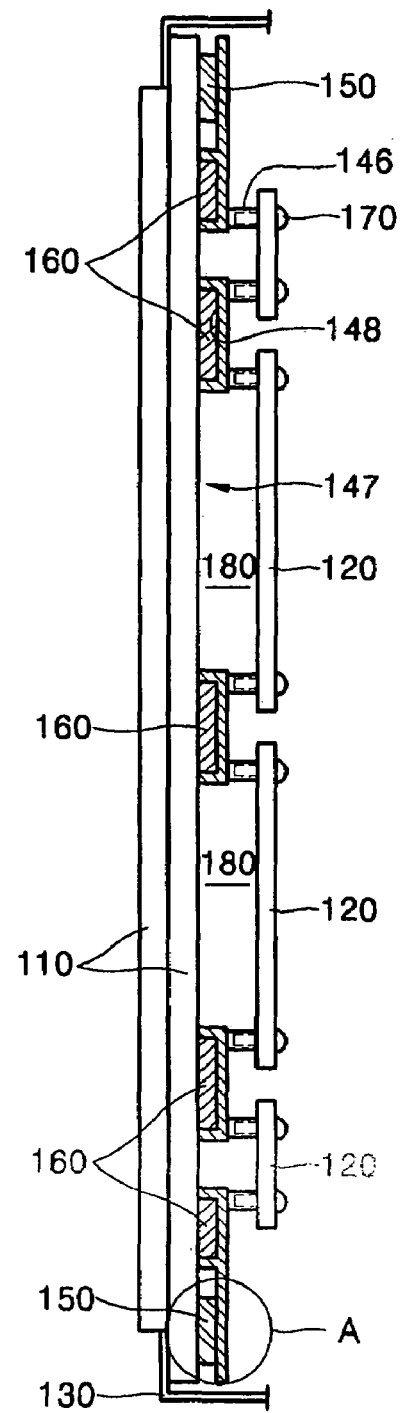
FIG. 2 is a cross-sectional view taken along the line II-II of FIG. 1 when the plasma display device is assembled.

FIG. 1 is an exploded perspective view of a plasma display device according to an embodiment of the present invention, and FIG. 2 is a cross-sectional view taken along the line II-II of FIG. 1 when the plasma display device is assembled.

Referring to FIGS. 1 and 2, the plasma display device 100 includes a plasma display panel 110, a circuit board 120, and a chassis base 140.

The plasma display panel 110 generates an image through a gas discharge, and various plasma display panels can be employed, for example, an alternating current type plasma display panel having a surface discharge three-electrode structure.

The alternate type plasma display panel having a surface discharge three-electrode structure includes a front panel and a rear panel. The rear panel is attached to and faces the front panel. Here, the front panel can include i) a front substrate on its front, ii) sustain electrode pairs formed on the rear surface of the front substrate, iii) a front dielectric layer formed to cover the sustain electrode pairs, and iv) a protection layer formed on the rear surface of the front dielectric layer. The sustain electrode pairs include a common electrode and a scan electrode separated from each other by a discharge gap. The rear panel includes i) a rear substrate, ii) address electrodes formed on the front surface of the rear substrate and crossing the sustain electrode pairs, iii) a rear dielectric layer covering the address electrodes, iv) barrier ribs formed on the front surface of the rear dielectric layer and defining discharge cells, and v) phosphor layers in each of the discharge cells. Each of the discharge cells corresponds to each region in which the sustain electrode pairs cross the address electrodes, and a discharge gas fills the discharge cells.

The plasma display panel 110 having the above structure is driven by at least one circuit board. Referring to FIGS. 1 and 2, the plasma display panel 110 includes a plurality of circuit boards 120 electrically connected to each other. Various electronic devices for driving the plasma display panel 110 are mounted on the circuit boards 120, including a device for supplying power to the plasma display panel 110 and a device for applying signals for displaying an image on the plasma display panel 110. An electrical signal generated by the circuit boards 120 is transmitted to the plasma display panel 110 by a signal transmitting member 130. In one embodiment, the signal transmitting member 130 includes a flexible printed cable (FPC), a tape carrier package (TCP), or a chip on film (COF).

The plasma display panel 110 and the circuit boards 120 are coupled to the chassis base 140. The chassis base 140 supports the plasma display panel 110 and the circuit board 120. Furthermore, the chassis base 140 dissipates heat received from the plasma display panel 110 and the circuit board 120, generated during operation of the plasma display device 100. The chassis base 140, the plasma display panel 110, and the circuit boards 120 constitute the plasma display device 100 and are accommodated in a case (not shown).

The chassis base 140 is shaped to be coupled to and in parallel with the rear surface of the plasma display panel 110. In one embodiment, the chassis base 140 is formed of a material in which plastic and a conductive material are mixed. In another embodiment, the chassis base 140 is formed of a mixed one of i) a non-conductive material and ii) a conductive material, wherein the non-conductive material is lighter in weight than the conductive material.

Figure 3:
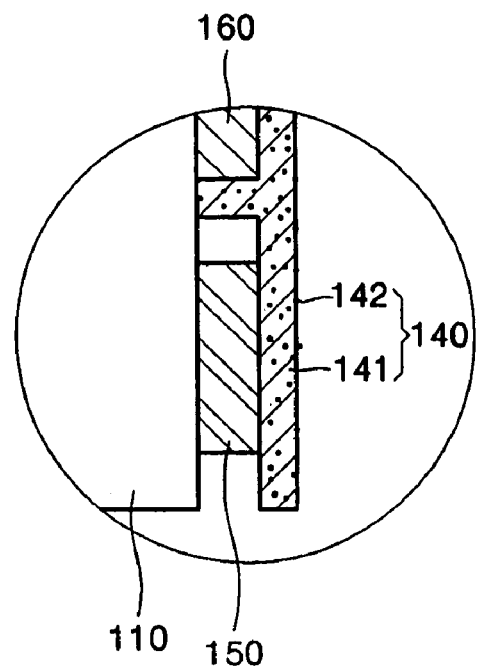
FIG. 3 is an enlarged cross-sectional view of the region A in FIG. 2.

In one embodiment, the chassis base 140, as depicted in FIG. 3, can be a structure having a main body unit 141 formed of plastic and a conductive unit 142 formed of the conductive material. In one embodiment, the conductive unit 142 is distributed over the main body unit 141. The main body unit 141 has an overall appearance of the chassis base 140.

In one embodiment, the chassis base 140 having the above structure can be manufactured by injection molding using plastic or other lightweight non-conductive material (hereinafter will be referred to "plastic" for convenience) in which a conductive powder is added. In one embodiment, the added conductive material can be silver (Ag), nickel Ni), or graphite (C). Since the chassis base 140 is formed of plastic mixed with the conductive material, a light weight plasma display device 100 can be manufactured, and grounding and EMI shielding of the circuit boards 120 and the signal transmitting member 130 can be achieved through the chassis base 140.

If the chassis base 140 is manufactured only of plastic, the weight of the chassis base 140 is reduced, but the grounding and EMI shielding of the circuit boards 120 and the signal transmitting member 130 cannot be obtained since the chassis base 140 is not conductive. In this case, a separate structure for grounding and EMI shielding of the circuit boards 120 and the signal transmitting member 130 must be added. On the other hand, if the chassis base 140 is formed only of the conductive material, the grounding and EMI shielding of those electrical elements 120 and 130 can be achieved, but the weight of the chassis base 140 increases.

When the chassis base 140 is formed of plastic mixed with a conductive material, the weight of the chassis base 140 can be reduced compared to a conductive chassis base, while the grounding and EMI shielding of the circuit boards 120 and the signal transmitting member 130 can be achieved. Furthermore, since the conductive material forming the chassis base 140 generally has high thermal conductivity, the dissipating efficiency of heat received from the plasma display panel 110 and the circuit boards 120 increases.

In one embodiment, the chassis base 140 having the above structure can be coupled to the plasma display panel 110 using an adhesive member 150, such as double sided tape, interposed around the edges between the chassis base 140 and the plasma display panel 110. As depicted in FIG. 1, the adhesive member 150 couples the chassis base 140 to the plasma display panel 110. Fixing units 145 for coupling the chassis base 140 to the case using a typical method can be formed at the corners of the chassis base 140.

A mounting structure, which corresponds to the circuit boards 120 and attaches the circuit boards 120 to the chassis base 140, is formed on the rear side of the chassis base 140. As depicted in FIG. 1, the mounting structure can include a plurality of bosses 146. The bosses 146 protrude from the rear side of the chassis base 140 and separated from each other. Screw holes can be formed in the ends of the bosses 146, and the circuit boards 120 can be fixed to the chassis base 140 by, for example, screws 170 installed from the rear side of the circuit boards 120 through screw holes in the circuit boards 120. The present invention is not limited thereto, and the coupling between the bosses 146 and the circuit boards 120 can also be achieved by various mechanical methods, such as a rivet coupling or other suitable connecting members.

In one embodiment, the bosses 146 can be formed when the chassis base 140 is injection molded using a material in which plastic and a conductive material are mixed. Accordingly, the manufacturing process and manufacturing costs of the bosses 146 can be reduced, since the bosses 146 can be integrally manufactured with the chassis base 140. Also, since the bosses 146 are conductive like the chassis base 140, the grounding and EMI shielding of the circuit boards 120 can be achieved through the chassis base 140 via the bosses 146.

At least one opening 147 can be formed on the chassis base 140. Referring to FIG. 1, the opening 147 can be divided into multiple small openings, and the divided openings can be aligned with the circuit boards 120. The opening 147 not only reduces the weight of the chassis base 140, but also serves as an insulating space 180 between the circuit boards 120 and the plasma display panel 110. The insulation space 180 prevents heat transfer in either direction between the plasma display panel 110 and the circuit boards 120. The openings 147 may be sized to fit the circuit boards 120 to maximize this effect.

Heat conduction members 160 can be located in regions outside the coupling regions between the chassis base 140 and the plasma display panel 110. The heat conduction members 160 aid the diffusion of heat from the plasma display panel 110 in a plane direction of the plasma display panel 110 and transfers the heat to the chassis base 140. In one embodiment, for this purpose, the heat conduction members 160 may be tightly attached to the back side of the plasma display panel 110. In another embodiment, the heat conduction members 160 can be fixed to the chassis base 140 to aid installation. That is, a pattern of grooves 148 (see FIG. 2) are formed on the surface of the chassis base 140 facing the plasma display panel 110, and the heat conduction members 160 having a shape corresponding to the shape of the grooves 148 can be fixed by being inserted into the grooves 148.

Figure 4:
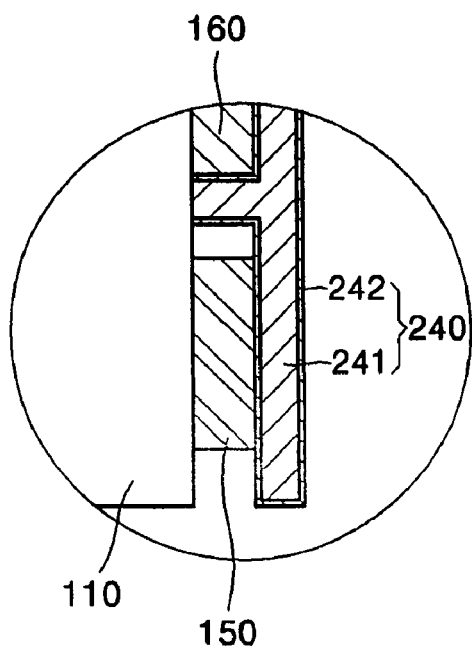
FIG. 4 is a cross-sectional view of a modified example of the chassis base of FIG. 3.

Another example of a chassis base structure is depicted in FIG. 4. In one embodiment, the chassis base 240 has a structure in which a main body 241 is formed of plastic and a conduction unit 242 is formed of a conductive material. In this embodiment, the conduction unit 242 can be located on at least part of the outer surface of the main body 241. In one embodiment, the main body 241 can be injection molded using plastic, and the conduction unit 242 can be formed by coating a conductive powder on the outer surface of the main body 241. In one embodiment, the conduction unit 242 may be formed on the entire outer surface of the main body 241, or may be confined to regions necessary for the grounding and EMI shielding of the circuit boards 120 and the signal transmitting member 130.

As described above, according to embodiments of the present invention, a lightweight plasma display device can be manufactured, since the weight of the chassis base can be reduced by manufacturing the chassis base from a mixed material of plastic and a conductive material. Also, the grounding and EMI shielding of the circuit board or a signal transmitting member can be achieved. Furthermore, manufacturing costs can be reduced since a mounting structure for mounting circuit boards can be integrally formed with the chassis base.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display device, comprising:
a plasma display panel on which an image is displayed;
a chassis base coupled to the rear side of the plasma display panel and formed of a material in which plastic and a conductive material are mixed; and
at least one circuit board mounted on the rear side of the chassis base and configured to drive the plasma display panel,
wherein the chassis base includes at least one opening which is substantially parallel with the at least one circuit board.

2. The plasma display panel of claim 1, wherein the chassis base is injection molded using plastic mixed with a conductive material.

3. The plasma display panel of claim 1, wherein the conductive material is one of the following or an alloy thereof: silver (Ag), nickel (Ni), and graphite (C).

4. The plasma display panel of claim 1, wherein the opening has a shape and size similar to those of the circuit board.

5. The plasma display panel of claim 4, further comprising a heat conduction member formed between the plasma display panel and the chassis base, wherein the heat conduction member includes at least one opening which is aligned with each of the at least one opening of the chassis base.

6. The plasma display panel as in claim 1, further comprising grooves configured to insert heat conduction members and formed on the surface of the chassis base facing the plasma display panel.

7. The plasma display panel as in claim 1, further comprising a mounting structure configured to mount the circuit board and integrally formed with the chassis base on the back side of the chassis base.

8. The plasma display panel of claim 7, wherein the mounting structure includes a plurality of bosses formed to be coupled with screws passing through the circuit board.

9. The plasma display panel of claim 1, further comprising an adhesive member coupling and disposed between the chassis base and the plasma display panel.

10. A plasma display device, comprising:
a chassis base, having two opposing surfaces, configured to support a plasma display panel in one surface and at least one circuit board in the other surface, wherein the chassis base is formed of the combination of a non-conductive material and a conductive material, wherein the non-conductive material is lighter in weight than the conductive material, and wherein the chassis base includes at least one opening which is substantially parallel with the at least one circuit board.

11. The plasma display panel of claim 10, wherein the chassis base comprises a main body formed of the non-conductive material and a conduction unit formed of the conductive material distributed over the main body.

12. The plasma display panel of claim 11, wherein the conduction unit includes a conductive powder coated on the outer surface of the main body.

13. The plasma display panel of claim 10, wherein the non-conductive material is plastic.

14. The plasma display panel of claim 10, wherein the conductive material is at least one of the following: silver (Ag), nickel (Ni), and graphite (C).

15. The plasma display panel of claim 10, wherein the opening has a shape and size similar to those of the circuit board.

16. The plasma display panel of claim 10, further comprising a heat conduction member formed between the plasma display panel and the chassis base, wherein the heat conduction member includes at least one opening which is aligned with each of the at least one opening of the chassis base.

17. A plasma display device, comprising:
a plasma display panel on which an image is displayed;
a chassis base coupled to the rear side of the plasma display panel and formed of plastic and a conductive material; and
at least one circuit board mounted on the rear side of the chassis base and configured to drive the plasma display panel, wherein the chassis base includes at least one opening which is substantially parallel with the at least one circuit board.

18. The plasma display panel of claim 17, wherein the chassis base comprises a main body formed of plastic and a conduction unit formed of a conductive material distributed over the main body.

19. The plasma display panel of claim 17, wherein the chassis base comprises a main body formed of plastic and a conduction unit formed of a conductive material on at least part of the outer surface of the main body.

20. The plasma display panel of claim 19, wherein the conduction unit includes a conductive powder coated on the outer surface of the main body.

21. The plasma display panel of claim 17, wherein the opening has a shape and size similar to those of the circuit board.

22. The plasma display panel of claim 17, further comprising a heat conduction member formed between the plasma display panel and the chassis base, wherein the heat conduction member includes at least one opening which is aligned with each of the at least one opening of the chassis base.

* * * * *